(12) United States Patent
Shen

(10) Patent No.: US 12,482,674 B2
(45) Date of Patent: Nov. 25, 2025

(54) WAFER CLEANING AND DRYING DEVICE

(71) Applicant: HANGZHOU SIZONE ELECTRONIC TECHNOLOGY INC., Zhejiang (CN)

(72) Inventor: Linghan Shen, Zhejiang (CN)

(73) Assignee: HANGZHOU SIZONE ELECTRONIC TECHNOLOGY INC., Zhejiang (CN)

( * ) Notice: Subject to any disclaimer, the term of this patent is extended or adjusted under 35 U.S.C. 154(b) by 733 days.

(21) Appl. No.: 17/785,054

(22) PCT Filed: Sep. 29, 2020

(86) PCT No.: PCT/CN2020/118797
§ 371 (c)(1),
(2) Date: Jun. 14, 2022

(87) PCT Pub. No.: WO2021/189802
PCT Pub. Date: Sep. 30, 2021

(65) Prior Publication Data
US 2023/0005761 A1  Jan. 5, 2023

(30) Foreign Application Priority Data

Mar. 23, 2020 (CN) .......................... 202010207748.4

(51) Int. Cl.
*H01L 21/67* (2006.01)
*H01L 21/677* (2006.01)

(52) U.S. Cl.
CPC .. *H01L 21/67034* (2013.01); *H01L 21/67057* (2013.01); *H01L 21/67751* (2013.01)

(58) Field of Classification Search
CPC ............. H01L 21/67034; H01L 67/057; H01L 67/67751

(Continued)

(56) References Cited

U.S. PATENT DOCUMENTS 7,513,062 B2 * 4/2009 Achkire ............ H01L 21/02052
  134/32
7,980,000 B2 * 7/2011 Lewis ............... H01L 21/68707
  34/80

(Continued)

FOREIGN PATENT DOCUMENTS

CN 101086955 12/2007
CN 109148341 1/2019

(Continued)

OTHER PUBLICATIONS

"Office Action of Korean Counterpart Application", issued on Feb. 27, 2024, with English translation thereof, pp. 1-8.

(Continued)

*Primary Examiner* — Connor J Tremarche
(74) *Attorney, Agent, or Firm* — JCIPRNET

(57) ABSTRACT

A wafer cleaning and drying device includes: a box used to clean the wafer, an opening is arranged at the top of the box for the wafer to enter or exit the box; a support part arranged inside the box and used to hold the wafer, the support part can move upward and downward; a spraying pipe arranged at the opening and used to spray the drying gas onto the surface of the cleaned wafer. The wafer cleaning and drying device dries the surface of the wafer with the spraying pipe arranged at the opening of the box, which sprays the drying gas onto the surface of the cleaned wafer. Understandably, Marangoni effect is used in the present prevention the water attached to the surface of the wafer is eliminated on basis of surface tension gradient difference.

4 Claims, 3 Drawing Sheets

(58) Field of Classification Search
USPC .............................................................. 34/78
See application file for complete search history.

(56) References Cited

U.S. PATENT DOCUMENTS

| | | | | |
|---|---|---|---|---|
| 8,863,957 | B2 * | 10/2014 | Kusuhara ................ | H10F 71/00 |
| | | | | 134/25.4 |
| 2004/0050405 | A1 * | 3/2004 | Christenson ...... | H01L 21/67051 |
| | | | | 134/32 |

FOREIGN PATENT DOCUMENTS

| | | |
|---|---|---|
| CN | 110391157 | 10/2019 |
| CN | 111092036 | 5/2020 |
| KR | 20050042224 | 5/2005 |
| TW | 200301504 | 7/2003 |
| TW | 200535920 | 11/2005 |
| TW | 201513201 | 4/2015 |

OTHER PUBLICATIONS

"International Search Report (Form PCT/ISA/210) of PCT/CN2020/118797," mailed on Jan. 4, 2021, with English translation thereof, pp. 1-4.
"Office Action of Taiwan Counterpart Application", issued on Mar. 24, 2022, p. 1-p. 6.

* cited by examiner

WAFER CLEANING AND DRYING DEVICE

CROSS-REFERENCE TO RELATED APPLICATION

This application is a 371 of international application of PCT application serial no. PCT/CN2020/118797, filed on Sep. 29, 2020, which claims the priority benefit of China application no. 202010207748.4, filed on Mar. 23, 2020. The entirety of each of the above-mentioned patent applications is hereby incorporated by reference herein and made a part of this specification.

TECHNICAL FIELD

The present invention relates to the technical field of semiconductor technological equipment, more specifically, to a wafer cleaning and drying device.

RELATED ART

During the manufacturing process of the semiconductor integrated circuit chip, chemical mechanical planarization needs to be carried out on the wafer—polish the wafer surface with a large amount of grinding fluid and different chemical reagents, such chemical mechanical planarization is a wet process, and at the end of such process, the wafer needs to be cleaned and dried to remove the particles attached onto its surface.

In the prior art, the wafer surface is usually dried by rotary drying, and the cleaning liquid is eliminated from the wafer surface under the centrifugal force generated when the wafer is rotated at a high speed. However, water residue may occur due to different materials or surface textures and patterns of wafers, and result in excessive amount of particles on wafers.

Therefore, providing a wafer cleaning and drying device which can effectively eliminate water residue from the wafer surface is an urgent problem for those skilled in the art.

SUMMARY OF INVENTION

In view of above, the purpose of the present invention is to provide a wafer cleaning and drying device which can effectively eliminate water residue from the wafer surface to avoid excessive amount of particles on the wafer.

In order to achieve above purpose, the present invention provides following technical scheme:

A wafer cleaning and drying device, which consists of:

A box used to clean the wafer, and an opening is arranged at the top of the box for the wafer to enter or exit the box;

A support part arranged inside the box and used to hold the wafer, and the support part can move upward and downward;

A spraying pipe arranged at the opening and used to spray the drying gas onto the surface of the cleaned wafer.

Preferably, the number of the spraying pipes is 2, and the 2 spraying pipes are arranged in a staggered manner to respectively spray the drying gas onto the front and rear surfaces of the wafer.

Preferably, a linear drive part is arranged outside the box, a $1^{st}$ magnet is arranged at the output end of the linear drive part, a $2^{nd}$ magnet is fixed onto the support part, and the $1^{st}$ magnet is attracted to the opposite pole of the $2^{nd}$ magnet; when the linear drive part outputs reciprocating motion, the $2^{nd}$ magnet drives the support part to synchronously move upward and downward.

Preferably, a guide post or a guide groove is fixedly arranged inside the box to guide moving upward and downward of the support part.

Preferably, the support part consists of:

A $1^{st}$ slide block, and a pin is arranged on the $1^{st}$ slide block to contact with the side of the wafer;

A $2^{nd}$ slide block, and a groove is arranged on the $2^{nd}$ slide block to clamp the wafer.

Preferably, it further consists of claws used to clamp the upper part of the wafer when the wafer protrudes from the opening.

Preferably, a rotatable guide rail is arranged at the top of the box, and the claws can be slidably arranged in the guide rail.

Preferably, it further consists of a bracket used to clamp the wafer after the wafer is fully dried, and the bracket is retractable.

Preferably, an overturning part is arranged at the top of the box, the guide rail is connected with the output end of the overturning part, and the fixing part of the bracket is fixedly connected with the guide rail.

The wafer cleaning and drying device provided in the present invention dries the surface of the wafer with the spraying pipe arranged at the opening of the box, which sprays the drying gas onto the surface of the cleaned wafer. Understandably, Marangoni effect is used in the present prevention—the water attached to the surface of the wafer is eliminated on basis of surface tension gradient difference. Compared with the prior art, the wafer cleaning and drying device can effectively reduce water residue and avoid excessive amount of particles on the wafer.

In a preferred scheme of the present invention, the guide rail and the bracket are overturned through the overturning part, the guide rail drives both the claws and the bracket to synchronously rotate, and makes the wafer clamped between the claws and the bracket rotate accordingly and away from the opening of the box, so the next to-be-cleaned wafer can enter the box quickly and the utilization rate of the box can be improved.

BRIEF DESCRIPTION OF DRAWINGS

In order to more clearly explain the embodiments of the present invention or the technical scheme in the prior art, the drawings needed for describing the embodiments of the present invention or the prior art are briefly introduced as follows. It is obvious that the drawings described below are only the embodiments of the present invention, and other drawings can be obtained by those skilled in the art according to the attached drawings and without creative work.

DESCRIPTION OF EMBODIMENTS

The technical schemes of the embodiments of the present invention are clearly and fully described below by combing the attached drawings. It is obvious that the embodiments described below are only certain but not all embodiments of the present invention. All the other embodiments of the present invention obtained by those skilled in the art according to the embodiments described below and without creative works belong to the protection scope of the present invention.

The purpose of the present invention is to provide a wafer cleaning and drying device which can effectively eliminate water residue from the wafer surface to avoid excessive amount of particles on the wafer.

Figure 1:
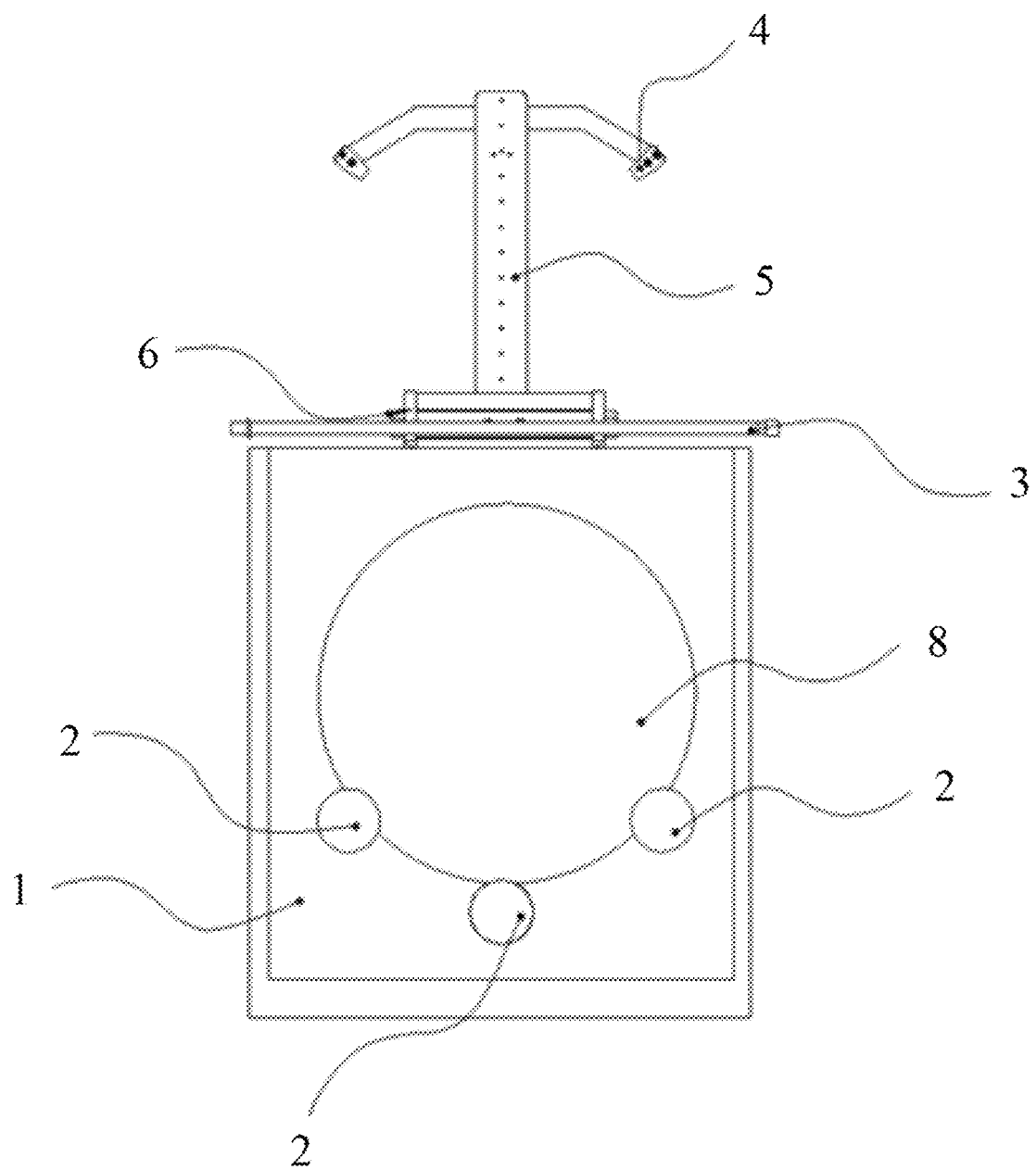
FIG. 1 is a front view of the wafer cleaning and drying device (the front wall of the box is not shown) provided in the embodiment of the present invention, and the wafer is being cleaned.
Figure 2:
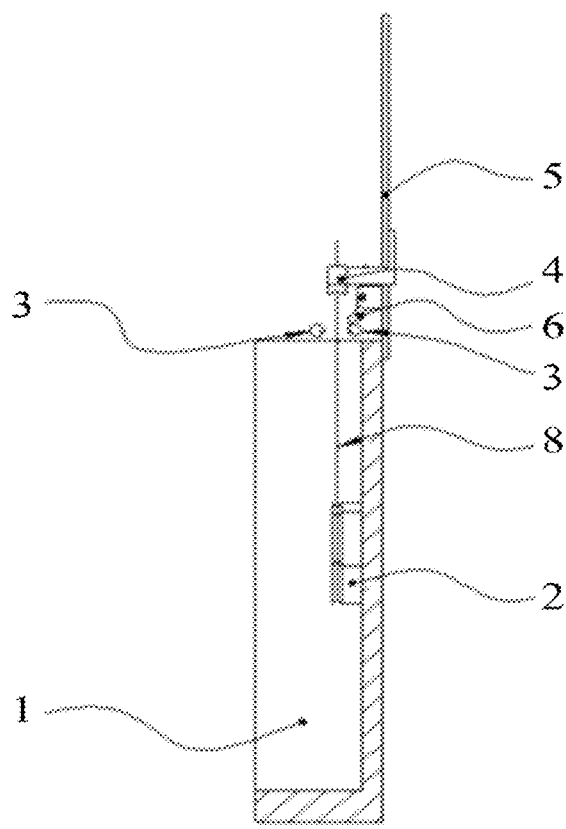
FIG. 2 is a side view of the wafer cleaning and drying device as shown in FIG. 1, and the wafer is rising.
Figure 3:
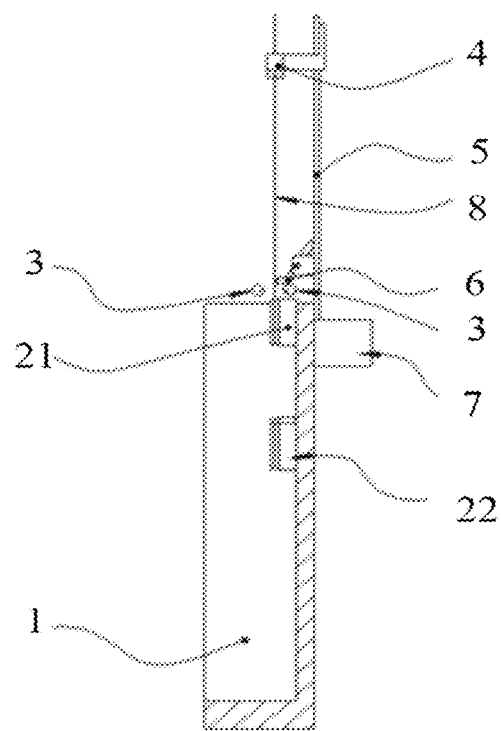
FIG. 3 is a side view of the wafer cleaning and drying device as shown in FIG. 1, and the wafer rises to the top position.
Figure 4:
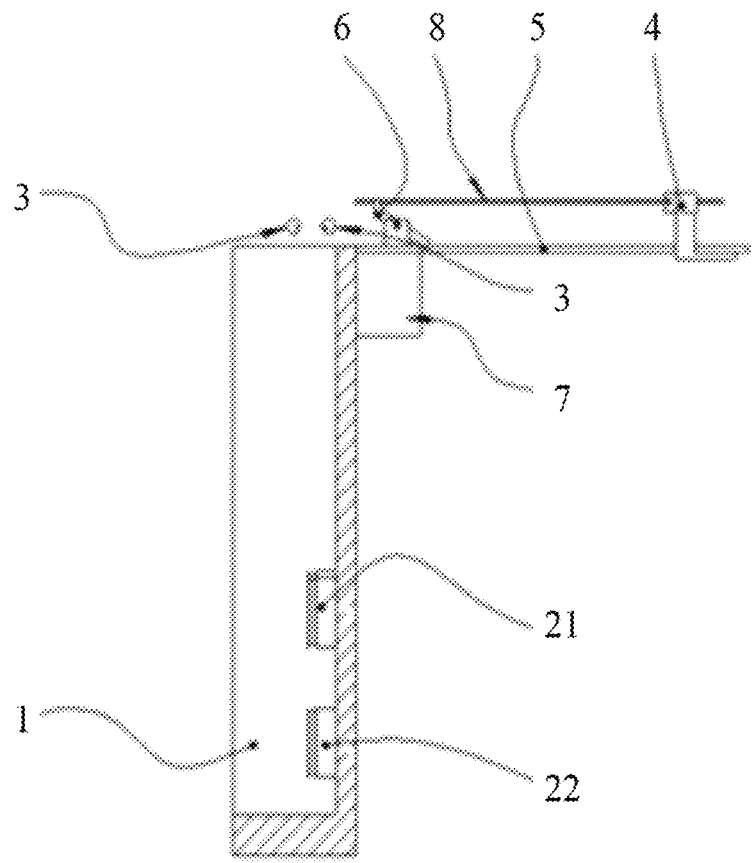
FIG. 4 is a side view of the wafer cleaning and drying device as shown in FIG. 3, and the guide rail is overturned.
Figure 5:
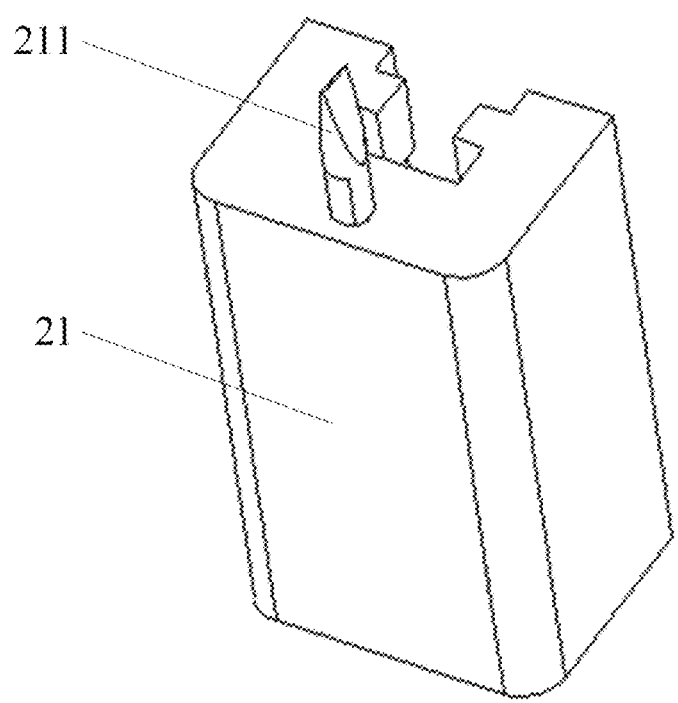
FIG. 5 is a structural view of the 1$^{st}$ slide block of the wafer cleaning and drying device provided in the embodiment of the present invention.

Please refer to FIGS. 1-5: FIG. 1 is a front view of the wafer cleaning and drying device (the front wall of the box is not shown) provided in the embodiment of the present invention, and the wafer is being cleaned; FIG. 2 is a side view of the wafer cleaning and drying device as shown in FIG. 1, and the wafer is rising; FIG. 3 is a side view of the wafer cleaning and drying device as shown in FIG. 1, and the wafer rises to the top position; FIG. 4 is a side view of the wafer cleaning and drying device as shown in FIG. 3, and the guide rail is overturned; FIG. 5 is a structural view of the 1st slide block of the wafer cleaning and drying device provided in the embodiment of the present invention.

The present invention provides a wafer cleaning and drying device, which mainly consists of a box 1, a support part 2 and a spraying pipe 3.

Specifically, the box 1 is used to contain cleaning liquid and clean the wafer 8.

An opening is arranged at the top of the box 1, the wafer 8 can enter the box 1 from the opening, and the cleaned wafer 8 can protrude out of the box from the opening.

The support part is arranged outside the box 1, it is used to hold the wafer 8 and to support the wafer 8.

Moreover, the support part 2 can move upward and downward, when the support part 2 moves upward, the wafer can be placed onto the support part 2, in addition, through moving upward of the support part 2, the cleaned wafer 8 can be pushed outside of the box 1; when the support part 2 moves downward, the wafer can fully sink in the cleaning solution in the box 1, the surface of the wafer 8 can be fully cleaned.

It shall be noted that, the specific support structure of the support part 2 for the wafer 8 is not limited in the present invention, as long as the support part 2 can stably support the wafer 8.

In addition, the specific method to realize moving upward and downward of the support part 2 is limited in the present invention, as long as the support part 2 can be driven to move upward and downward.

For example, a motor is arranged outside the box 1, the output end of the motor is connected with a screw rod, and the screw rod extends into the box 1 from the bottom of the box 1; the screw rod 1 is threaded with a special-shaped connecting rod, preferably, the special-shaped connecting rod is a U-shaped rod, and the support part 2 is connected with the other end of the special-shaped connecting rod. It shall be noted that a limit part is arranged inside the box 1 to limit moving upward and downward of the support part 2. When the motor drives the screw rod to rotate, the special-shaped connecting rod moves upward and downward along the screw rod, and drives the support part 2 to reciprocally move upward and downward, and realizes moving upward and downward of the support part 2. The spraying pipe 3 is arranged at the opening of the box 1 and used to spray the drying gas onto the surface of the cleaned wafer 8, such as spraying mixed steam of IPA and N2 onto the surface of the cleaned wafer 8 in order to dry the surface of the cleaned wafer 8.

Understandably, the drying gas is sprayed onto the surface of the cleaned wafer 8 as soon as the cleaned wafer 8 appears at the opening; the drying gas is continuously sprayed onto the surface of the cleaned wafer 8 exposed above the opening when the wafer 8 is gradually raised until the wafer 8 is completely above the opening, and eventually, the wafer 8 is fully dried.

It can be told that the wafer cleaning and drying device provided in the present invention dries the surface of the wafer 8 with the spraying pipe 3 arranged at the opening of the box 1, which sprays the drying gas onto the surface of the cleaned wafer 8. Understandably, Marangoni effect is used in the present prevention—the water attached to the surface of the wafer 8 is eliminated on basis of surface tension gradient difference. Compared with the prior art in which the surface of the wafer 8 is spin-dried with centrifugal force, the wafer cleaning and drying device can effectively reduce water residue and avoid excessive amount of particles on the wafer 8.

In order to well dry both the front and rear sides of the wafer 8, on basis of the above embodiment, the number of the spraying pipes 3 is 2, and the 2 spraying pipes 3 are arranged in a staggered manner to respectively spray the drying gas onto the front and rear surfaces of the wafer 8.

Understandably, arranging the 2 spraying pipes 3 in a staggered manner is to respectively arrange the 2 spraying pipes 3 perpendicular to the front or rear sides of the wafer 8, each spraying pipe 3 faces a side (the front or rear side) of the wafer 8, so both the front and rear sides of the wafer 8 can be well dried.

Considering specific method to realize moving upward and downward of the support part 2, as a preferred scheme, on basis of the above embodiment, a linear drive part is arranged outside the box 1, a 1st magnet is arranged at the output end of the linear drive part, a 2nd magnet is fixedly arranged on the support part 2, and the 1st magnet is attracted to the opposite pole of the 2nd magnet; when the linear drive part outputs reciprocating motion, the 2nd magnet drives the support part 2 to synchronously move upward and downward.

Which means in this embodiment, upon the magnetic attraction between the 1st magnet and the 2nd magnet, the 1st magnet reciprocally moves, the 2nd magnet synchronously moves and drives the support part 2 to move upward and downward.

Understandably, in this scheme, the preferred material of the box 1 shall have good magnetic conductivity.

Preferably, the output end of the linear driving part is arranged parallel to the wall of the box 1.

The specific structure of the linear driving part is not limited in the present invention, for example, the linear driving part can be a cylinder.

In order to assure the moving upward and downward path of the support part 2, on basis of the above embodiment, a guide part is fixedly arranged inside the box 1 to guide moving upward and downward of the support part 2, such as a guide post or a guide groove.

Which means that, the support part 2 moves upward and downward along the direction limited by the guide post or the guide groove to assure the stability of the support part 2.

Moreover, considering the stable support provided by the support part 2 to the wafer 8, and in order to minimize the contact area between the support part 2 and the wafer 8, on basis of the above embodiment, the support part 2 consists of a 1st slide block 21 and a 2nd slide block 22, a pin 211 is arranged on the 1st slide block 21 to contact with the side of the wafer 8, and a groove is arranged on the 2nd slide block 22 to clamp the wafer 8.

Which means that, in this embodiment, the wafer 8 is supported through the joint action of the 1st slide block 21 and the 2nd slide block 22.

Understandably, the 2nd slide block 22 is mainly used to fix the wafer 8, the 2nd slide block 22 clamps the wafer 8, assures that the original status of the wafer 8 does not change after the wafer 8 enters the box 1, and prevents the wafer 8 from tilting back and forth.

The 1st slide block contacts with the wafer 8 through the pin 211, so the contact area between the support 2 and the wafer 8 is decreased, after the cleaned wafer 8 protrudes from the opening of the box 1, blocking the surface of the wafer 8 by the support part 2 can be avoided as much as possible, and the surface of the wafer 8 can be bully dried.

It shall be noted that, numbers of the 1st slide blocks 21 and the 2nd slide blocks 22 are not limited in this embodiment. Preferably, the number of the 1st slide blocks 21 is 1, the number of the 2nd slide blocks 22 is 2, the two 2nd slide blocks 22 are arranged on both sides of the 1st slide block 21.

In order to make sure that all parts of the wafer 8 are sprayed with the drying gas, on basis of the above embodiment, claws 4 are arranged to clamp the upper part of the wafer 8 when the wafer 8 protrudes from the opening.

Understandably, since the spraying pipe 3 is arranged at the opening, as soon as the wafer 8 appears at the opening, the parts of the wafer 8 exposed above the opening will be sprayed with the drying gas, in another word, after the wafer 8 protrudes from the opening, the parts of the wafer 8 clamped by the claws 4 have been sprayed with the drying gas.

Preferably, as shown in FIG. 1, the number of the claws 4 is 2 to fix both upper sides of the wafer 8 and to prevent the wafer 8 from tilting back and forth.

It shall be noted that, in this scheme, since the claws 4 clamp the wafer 8 when the wafer 8 raises to a certain height, the 2nd slide block 22 can be moved downward, so the 2nd slide block 22 can separate from the wafer 8 to prevent that the 2nd slide block 22 contacts with the wafer 8 and forms a dead corner which can't be sprayed with drying gas.

Understandably, when the 2nd slide block 22 separates from the wafer 8, the wafer 8 can be continuously raised with the support from the 1st slide block 21 and during continuous moving upward of the 1st slide block 21 until the wafer 8 is fully dried.

In order to prevent the claws 4 from interfering with the placement of the wafer 8 when placing the wafer 8 into the box 1, on basis of the above embodiment, a rotatable guide rail 5 is arranged at the top of the box 1, and the claws 4 can be slidably arranged in the guide rail 5.

Which means that, when placing the wafer 8 into the box 1, the claws 4 can be rotated away from the opening of the box 1 by rotating the guide rail 5, so the wafer 8 can be smoothly placed into the box 1; when the cleaned wafer 8 protrudes from the opening, the claws 4 can be rotated above the opening by rotating the guide rail 5 and making the guide rail 5 perpendicular to the top of the box 1.

Understandably, since the claws 4 can be slidably arranged in the guide rail 5, when the 1st slide block pushes the wafer 8 upward, with raising of the wafer 8, the claws 4 raise along the guide rail 5.

In order to move the cleaned wafer 8 away and enable the support part 2 to hold the next to-be-cleaned wafer 8, on basis of the above embodiment, a bracket 6 is arranged to clamp the lower part of the wafer 8 after the wafer 8 is fully dried, and the bracket 6 is retractable.

Which means that, after the wafer 8 is fully dried, the bracket 6 protrudes to clamp the lower part of the wafer 8, the wafer is fixed under the joint action of the claws 4 and the bracket 6, the support part 2 moves downward and separates from the wafer 8 to hold the next to-be-cleaned wafer 8.

Understandably, interfering with the movement of the wafer 8 can be avoided when the bracket 6 retracts.

It shall be noted that, the specific retractable structure of the bracket 6 is not limited in this embodiment, as long as the bracket 6 is retractable.

In order to prevent the cleaned and dried wafer 8 from interfering the placement of the next to-be-cleaned wafer 8 into the box 1, on basis of the above embodiment, an overturning part 7 is arranged at the top of the box 1, the guide rail 5 is connected with the output end of the overturning part 7, and the fixing part of the bracket 6 is fixedly connected with the guide rail 5.

Which means that, in this embodiment, the guide rail 5 is driven to rotate by the overturning part 7. Preferably, the overturning part 7 drives the guide rail 5 to rotate between the horizontal and vertical planes.

Since the fixing part of the bracket 6 is fixedly connected with the guide rail 5, when the overturning part 7 drives the guide rail 5 to rotate, the guide rail 5 drives both the claws 4 and the bracket 6 to synchronously rotate, makes the wafer 8 clamped between the claws 4 and the bracket 6 rotate accordingly and away from the opening of the box 1, so the next to-be-cleaned wafer 8 can enter the box quickly and the utilization rate of the box 1 can be improved.

It shall be noted that, the specific structure of the overturning part 7 is not limited in this embodiment, for example, the overturning part 7 can be a servo motor, the guide rail 5 can be overturned by rotating the output shaft of the servo motor at a certain angle. The overturning part 7 can also be a cylinder matched with a rotating shaft, the guide rail 5 can be overturned by driving the guide rail 5 to rotate around the rotating shaft by the cylinder.

Preferably, the overturning part 7 is fixedly arranged on outer wall of the box 1.

It shall be noted that, in the Description, terms like the 1st and the 2nd are used to distinguish a subject or operation from another subject or operation, and they do not specify or imply any relationship or sequence among such subjects or operations.

The embodiments are described in a progressive manner in the Description, differences of each embodiment from other embodiments are highlighted, and for the same and similar contents of the embodiments, refer to given introduction.

The wafer cleaning and drying device provided by the present invention is described in detail above. Both the principle and embodiments of the present invention are introduced through specific embodiments; the description of above embodiments is only used for better understanding the method and core idea of the present invention. It shall be noted that the present invention can be improved and modified by those skilled in the art under the precondition of not deviating from the principle of the prevent invention, and such improvements and modifications belong to the protection scope of the claims of the present invention.

What is claimed is:

1. A wafer cleaning and drying device, comprising:
a box used to clean a wafer, and an opening is arranged at a top of the box for the wafer to enter and exit the box;
a support part arranged inside the box and used to hold the wafer, and the support part is movable upwardly and downwardly, wherein the support part comprises:
    a 1st slide block, and a pin is arranged on the 1st slide block and protruding from the 1st slide block, an end of the pin contacts a side of the wafer; and
    a 2nd slide block, and a groove is arranged on the 2nd slide block to clamp the wafer;
spraying pipes arranged at the opening and used to spray drying gas onto surfaces of the cleaned wafer;
claws used to clamp an upper part of the wafer when the wafer protrudes from the opening, wherein the claws are located outside the box and no parts of the claws extend into the box, wherein a guide rail which is rotatable is arranged at the top of the box, and the claws are slidably arranged in the guide rail; and
a bracket used to clamp the wafer after the wafer is fully dried, and the bracket is retractable, wherein an overturning part is arranged at the top of the box, the guide rail is connected with an output end of the overturning part, and a fixing part of the bracket is fixedly connected with the guide rail,
wherein the opening for the wafer to enter and exit the box is a single opening, when the guide rail is arranged at the top of the box, the claws are located at a path that the wafer passes through the opening, when the wafer enters the box, the overturning part drives the claws to rotate to a yielding position such that the claws leave the path so as to allow the wafer to pass through the opening,
wherein when the overturning part drives the guide rail to rotate, the guide rail drives both the claws and the bracket to synchronously rotate and makes the wafer clamped between the claws and the bracket rotate accordingly and away from the opening of the box, so that the opening is available for a next to-be-cleaned wafer to enter the box.

2. The wafer cleaning and drying device as recited in claim 1, wherein a number of the spraying pipes is 2, and the 2 spraying pipes are arranged in a staggered manner to respectively spray the drying gas onto the surfaces which are front and rear surfaces of the wafer.

3. The wafer cleaning and drying device as recited in claim 1, wherein a linear drive part is arranged outside the box, a 1st magnet is arranged at an output end of the linear drive part, a 2nd magnet is fixedly arranged on the support part, and the 1st magnet is attracted to an opposite pole of the 2nd magnet; when the linear drive part outputs reciprocating motions, the 2nd magnet drives the support part to synchronously move upward and downward.

4. The wafer cleaning and drying device as recited in claim 3, wherein a guide post or a guide groove is fixedly arranged inside the box to guide moving upward and downward of the support part.

* * * * *